(12) United States Patent
Dagher et al.

(10) Patent No.: US 10,243,578 B2
(45) Date of Patent: Mar. 26, 2019

(54) CONTINUOUS-TIME DELTA-SIGMA ADC WITH SCALABLE SAMPLING RATES AND EXCESS LOOP DELAY COMPENSATION

(71) Applicant: QUALCOMM Incorporated, San Diego, CA (US)

(72) Inventors: Elias Dagher, Aliso Viejo, CA (US); Yan Wang, San Diego, CA (US); Mohammad Meysam Zargham, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/440,612

(22) Filed: Feb. 23, 2017

(65) Prior Publication Data
US 2018/0241409 A1 Aug. 23, 2018

(51) Int. Cl.
*H03M 3/00* (2006.01)
*H03M 1/12* (2006.01)

(52) U.S. Cl.
CPC ........... *H03M 1/1245* (2013.01); *H03M 3/37* (2013.01); *H03M 3/396* (2013.01); *H03M 3/464* (2013.01); *H03M 3/458* (2013.01)

(58) Field of Classification Search
CPC ............................. H03M 1/1245; H03M 3/464
USPC .................................................. 341/143–155
See application file for complete search history.

(56) References Cited

U.S. PATENT DOCUMENTS

| | | | |
|---|---|---|---|
| 6,414,615 B1 | 7/2002 | Cheng | |
| 7,317,411 B1 * | 1/2008 | Nanda | H03M 3/334 341/131 |
| 7,365,667 B1 * | 4/2008 | Nanda | H03M 3/32 341/143 |
| 7,382,300 B1 * | 6/2008 | Nanda | H03M 3/346 341/143 |
| 7,948,412 B2 | 5/2011 | Aiba | |
| 8,072,362 B2 | 12/2011 | Lin et al. | |
| 8,130,127 B1 * | 3/2012 | Tsang | H03M 3/322 341/143 |
| 8,400,340 B2 | 3/2013 | Mishra et al. | |

(Continued)

OTHER PUBLICATIONS

Singh V., et al., "A 16MHz BW 75 dB DR CT ΔΣ ADC Compensated for More Than One Cycle Excess Loop Delay," IEEE Journal of Solid-State Circuits, Aug. 2012, vol. 47, No. 8, pp. 1884-1895.

(Continued)

*Primary Examiner* — Lam T Mai
(74) *Attorney, Agent, or Firm* — Patterson & Sheridan, L.L.P.

(57) ABSTRACT

Certain aspects of the present disclosure provide methods and apparatus for implementing sampling rate scaling of an excess loop delay (ELD)-compensated continuous-time delta-sigma modulator (CTDSM) analog-to-digital converter (ADC). One example ADC generally includes a loop filter; a quantizer having an input coupled to an output of the loop filter; one or more digital-to-analog converters (DACs), each having an input coupled to an output of the quantizer, an output coupled to an input of the loop filter, and a data latch comprising a clock input for the DAC coupled to a clock input for the ADC; and a clock delay circuit having an input coupled to the clock input for the ADC and an output coupled to a clock input for the quantizer.

20 Claims, 6 Drawing Sheets

(56) References Cited

U.S. PATENT DOCUMENTS

| | | | |
|---|---|---|---|
| 8,514,117 B2 * | 8/2013 | Srinivasan | H03M 3/37 327/172 |
| 8,542,138 B2 | 9/2013 | Galton et al. | |
| 8,552,894 B2 | 10/2013 | Huang et al. | |
| 8,638,251 B1 | 1/2014 | Hong et al. | |
| 8,760,331 B2 | 6/2014 | Kaald | |
| 9,106,211 B2 | 8/2015 | Wiesbauer et al. | |
| 9,325,341 B2 | 4/2016 | Dagher et al. | |
| 9,455,737 B1 * | 9/2016 | Rajaee | H03M 3/464 |
| 9,559,719 B1 | 1/2017 | Kauffman et al. | |
| 9,948,318 B1 | 4/2018 | Tsai | |
| 2007/0040718 A1 * | 2/2007 | Lee | H03M 7/3008 341/143 |
| 2010/0066422 A1 * | 3/2010 | Tsai | H03M 3/354 327/163 |
| 2012/0112936 A1 * | 5/2012 | Huang | H03M 1/502 341/110 |
| 2013/0063291 A1 * | 3/2013 | Srinivasan | H03M 3/37 341/136 |
| 2013/0214951 A1 * | 8/2013 | Ho | H03M 3/37 341/143 |
| 2016/0233872 A1 * | 8/2016 | Wei | H03M 3/37 |
| 2016/0365870 A1 | 12/2016 | Huang et al. | |

OTHER PUBLICATIONS

Afifi M et al: "A Study of Excess Loop Delay in Tunable Continuous-Time Bandpass Delta-Sigma Modulators Using RC-Resonators," Analog Integrated Circuits and Signal Processing, Springer New York LLC, US, vol. 79, No. 3, Apr. 10, 2014 (Apr. 10, 2014), XP035317586, pp. 555-568, ISSN: 0925-1030, DOI: 10.1007/S10470-014-0294-0 [retrieved on Apr. 10, 2014].

International Search Report and Written Opinion—PCT/US2018/013733—ISA/EPO—dated May 22, 2018.

Vikas Singh et al: "Compensating for Quantizer Delay in Excess of One Clock Cycle in Continuous-Time Delta\Sigma Modulators," IEEE Transactions on Circuits and Systems II: Express Briefs, IEEE, US, vol. 57, No. 9, Sep. 2010 (Sep. 2010), XP011318487, pp. 676-680, ISSN: 1549-7747.

Vishal Saxena et al: "Reconfigurable Continuous-Time Delta-Sigma Analog-to-Digital Converters for Software-Defined and Multi-Standard Radios," Proceedings of the SDR 11 Technical Conference and Product Exposition, Nov. 29, 2011 (Nov. 29, 2011), XP55474295, pp. 249-258, Retrieved from the Internet: URL:http://www.wirelessinnovation.org/assets/Proceedings/2011/2011-6a-saxena.pdf [retrieved on May 11, 2018].

* cited by examiner

CONTINUOUS-TIME DELTA-SIGMA ADC WITH SCALABLE SAMPLING RATES AND EXCESS LOOP DELAY COMPENSATION

TECHNICAL FIELD

Certain aspects of the present disclosure generally relate to electronic circuits and, more particularly, to a continuous-time delta-sigma modulator (CTDSM) analog-to-digital converter (ADC) with scalable sampling rates and excess loop delay (ELD) compensation.

BACKGROUND

Different types of analog-to-digital converters (ADCs) can convert an analog signal into a digital signal. For example, a continuous-time delta sigma (CTDSM) ADC uses a delta-sigma modulator to convert an analog signal to a digital signal. The CTDSM ADC may use a loop filter to move low frequency quantization noise up to higher frequencies outside the band of interest. The out-of-band noise may then be filtered out, which may improve the analog-to-digital conversion dynamic range.

A quantizer in the delta-sigma modulator may receive the output of the loop filter and perform the analog-to-digital conversion to output a digital signal. A feedback loop of the CTDSM ADC includes digital-to-analog converters (DACs) that convert the digital output of the quantizer to corresponding analog values. The analog values are then subtracted from the input signal of the loop filter or internal nodes within the loop filter, and the resulting signal is input back into the loop filter and then the quantizer.

Continuous-time delta-sigma ADCs may suffer from excess loop delay (ELD). Excess loop delay may be caused by a finite propagation delay between the time the quantizer samples the analog signal and the time that the feedback DACs present analog versions of the quantized samples back to the loop filter. The excess loop delay may degrade the stability of the CTDSM ADC and should be compensated for. For example, the CTDSM ADC may add an independent signal path, such as an excess loop delay compensation feedback path to compensate for the excess loop delay.

SUMMARY

Certain aspects of the present disclosure generally relate to methods and apparatus for implementing sampling rate scaling of an excess loop delay (ELD)-compensated continuous-time delta-sigma modulator (CTDSM) analog-to-digital converter (ADC).

Certain aspects of the present disclosure provide an ADC. The ADC generally includes a loop filter; a quantizer having an input coupled to an output of the loop filter; one or more digital-to-analog converters (DACs), each having an input coupled to an output of the quantizer, an output coupled to an input of the loop filter, and a data latch comprising a clock input for the DAC coupled to a clock input for the ADC; and a clock delay circuit having an input coupled to the clock input for the ADC and an output coupled to a clock input for the quantizer.

Certain aspects of the present disclosure provide a method for sampling rate scaling in an ADC having a loop filter, a quantizer coupled to the loop filter, and one or more DACs coupled between an output of the quantizer and one or more inputs of the loop filter. The method generally includes changing a sampling frequency of the ADC; clocking the one or more DACs with a first clock signal at the sampling frequency; at least one of: adjusting a first delay between the first clock signal and a second clock signal to scale with the sampling frequency; or adjusting a bandwidth of an amplifier in the loop filter to scale with the sampling frequency; and clocking the quantizer with the second clock signal at the sampling frequency.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
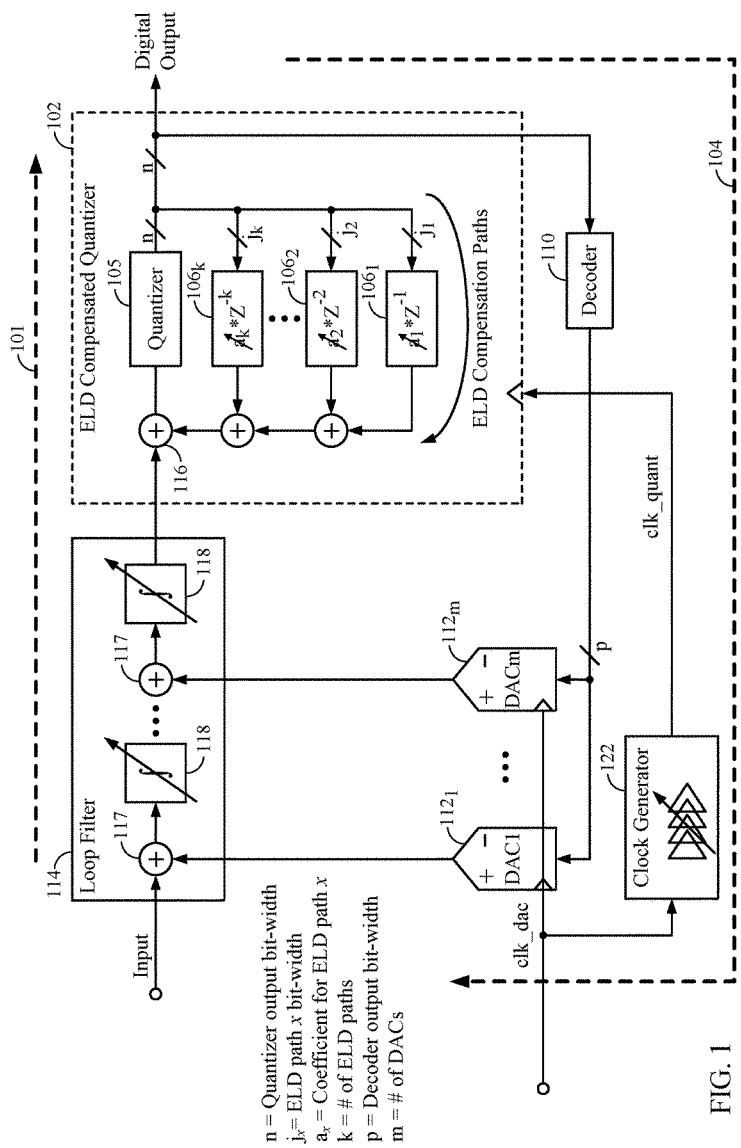
FIG. 1 is a block diagram of an example delta sigma analog-to-digital converter (ADC) with an excess loop delay (ELD)-compensated quantizer, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16 (WiMax), Long Term Evolution (LTE) (e.g., in TDD and/or FDD modes), or some other standards. A TDMA system may implement Global System for Mobile Communications (GSM) or some other standards. These various standards are known in the art.

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) or later system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and/or BSs may include an analog-to-digital converter (ADC) in the receive path (also referred to as a "receive chain") of a radio frequency front-end. The ADC may be used to convert received radio frequency (RF) signals that have been down-converted to baseband signals, filtered, and otherwise processed into digital signals for further signal processing in the digital domain. One example type of ADC suitable for this type of conversion includes continuous-time delta-sigma modulator (CTDSM) ADCs.

Example CTDSM ADC with Scalable Sampling Rates and ELD Compensation

Continuous-time delta-sigma modulator (CTDSM) analog-to-digital converters (ADCs) suffer from excess loop delay (ELD). ELD is caused by: (1) the finite propagation delay between the time the quantizer samples and the time that the feedback DACs present the quantized samples back into the loop; and (2) the finite bandwidth of the analog integrators used. This ELD degrades the CTDSM stability, and thus, it is desirable to compensate for the ELD by, for example, adding other independent signal paths (typically additional feedback paths). Conventional methods may not be flexible enough to allow for ELD compensation for varying CTDSM loop bandwidths (BWs) and sampling rates. The effective ELD caused by quantizer delay and integrator bandwidth varies with respect to Fs, which may force different ELD compensation coefficients or paths.

Conventional CTDSM ADCs are limited to a small number of particular sampling rates with explicit ELD compensation for those rates. One solution involves scaling only the integrator capacitors in the loop filter. However, this solution may limit the number of possible sampling rates that the ADC can accommodate, may force non-ideally shaped noise transfer functions or loop stability, and may result in additional compensation paths to address different ELDs for different Fs.

Certain aspects of the present disclosure provide for sampling rate (Fs) scaling of an ELD-compensated CTDSM ADC.

FIG. 1 is a block diagram of an example CTDSM ADC 100, in accordance with certain aspects of the present disclosure. The ADC 100 may include a main path 101, which may comprise a loop filter 114 and an ELD-compensated quantizer 102, and an ADC feedback path 104. The loop filter 114 may receive an analog input signal for the ADC 100 and may include one or more integrator stages 118. At least one of the integrator stages 118 may be tunable. The ELD-compensated quantizer 102 may include quantization logic 105 that may perform an analog-to-digital conversion, such as a time-to-digital converter (TDC) block. However, although a TDC block is discussed, other logic may also be used to perform the quantization function. Also, within the ELD-compensated quantizer 102, k multiple ELD compensation paths $106_1$, $106_2$, . . . $106_k$ (collectively referred to as "ELD compensation paths 106") are provided as quantizer feedback paths in an effort to compensate for different excess loop delays.

The ADC feedback path 104 may include a decoder 110 and m feedback digital-to-analog converters (DACs) $112_1$, $112_2, \ldots 112_m$ (collectively referred to as "DACs 112"). The ADC feedback path 104 may receive the digital output of the ELD-compensated quantizer 102, which converted an analog input signal to a digital output signal via the quantization logic 105. The output bit width of the digital output signal for the quantizer 102 is denoted by n bits. The ADC feedback path 104 converts the digital output signal into corresponding analog feedback signals via the m DACs 112. The analog feedback signals output from the DACs 112 are then input as feedback into the loop filter 114. In delta-sigma modulation, the analog feedback signals may be subtracted from the analog input signal, for example, via corresponding summing junctions 117 in the loop filter 114. Then, the loop filter 114 moves low frequency noise up to higher frequencies outside the band of interest. In a CTDSM ADC, the loop filter 114 may be implemented using continuous-time circuits, as opposed to discrete-time circuits. The DACs 112 may be clocked by an input clock signal (clk_dac) for the ADC 100. A tunable clock delay circuit 122, described in more detail below, may generate a delayed clock signal (clk_quant) based on clk_dac. A delta sigma ADC implemented by the ADC 100 of FIG. 1 may be understood by a person skilled in the art, and thus, a description detailing the operations of the ADC 100 is omitted.

The quantization logic 105 may sample an analog signal output by the loop filter 114 at a sample rate (Fs) based on clk_quant to perform the conversion of the analog signal to the digital signal. A finite delay from the quantizer 102 sampling to the time when quantized samples are presented back into the loop filter 114 by the feedback DACs 112 may result, and may be referred to as excess loop delay (ELD). The excess loop delay may degrade the stability of the ADC 100. In an effort to compensate for the ELD, multiple ELD compensation paths 106 are provided in the quantizer 102, as described above. The output of the ELD compensation paths 106 may be combined with the output from the loop filter 114 in a combiner 116 (e.g., a summing junction for addition, subtraction, etc.). Although the quantizer 102 includes ELD compensation paths 106, additional and/or alternative ELD paths may be provided in other portions of the ADC 100. For example, ELD compensation paths may be provided from the output of the quantizer 102 into the loop filter 114.

Each ELD compensation path 106, may have a bit width $j_x$. An ELD compensation path 106 may have a reduced resolution, $j_x < n$, to trade off ELD complexity with ADC noise, where n is the number of bits output by the quantization logic 105 in the digital output signal. That is, the resolution or bit width of an ELD path may be less than the bit width of the digital output from the quantizer 102. The amount of compensation for each path is represented by a coefficient $a_x$ for the ELD path $106_x$, and may be an order of a z transform. A different coefficient may compensate for a different excess loop delay.

The ELD compensation paths 106 may be programmed to provide compensation for different excess loop delays. For example, the ADC 100 may have changes in its configuration occur, such as changes in the sampling rate (Fs), loop filter amplifier tuning, quantizer reconfiguration, or any other system level change that results in different excess loop delay in the feedback path 104. When the different configurations result in different excess loop delays, certain aspects may program the ELD compensation paths 106 to compensate for the different delays. For example, the variable coefficients $a_x$ for the ELD compensation paths 106 may be programmed differently depending on the configuration of the ADC 100. Additionally, using multiple ELD compensation paths 106 may allow certain aspects to compensate for excess loop delays that are larger than the sampling period of the ADC 100. In this manner, the resulting signal outputted from the combiner 116 has been compensated for the excess loop delay.

Each ELD compensation path 106 may include one or more delay elements. For example, data (or delay) flip-flops (DFF) may provide different delays in the ELD compensation paths 106. In one example, ELD compensation path $106_1$ includes three D flip-flops, ELD compensation path $106_2$ includes two D flip-flops, ELD compensation path $106_k$ includes one D flip-flop, and so on. The different number of D flip-flops may introduce a different delay for each ELD compensation path 106, and the number of flip-flops in each ELD compensation path 106 may be configurable.

Each ELD compensation path 106 may be individually programmed. The programming of the ELD compensation paths 106 may be performed dynamically or pre-set. Any reprogramming may be performed based on various changes in the configuration of the ADC 100, such as a result of a change in the sampling rate (Fs), internal loop filter amplifier tuning, quantizer reconfiguration, or any other system-level change that will impact the ELD in any of the feedback paths.

Figure 2:
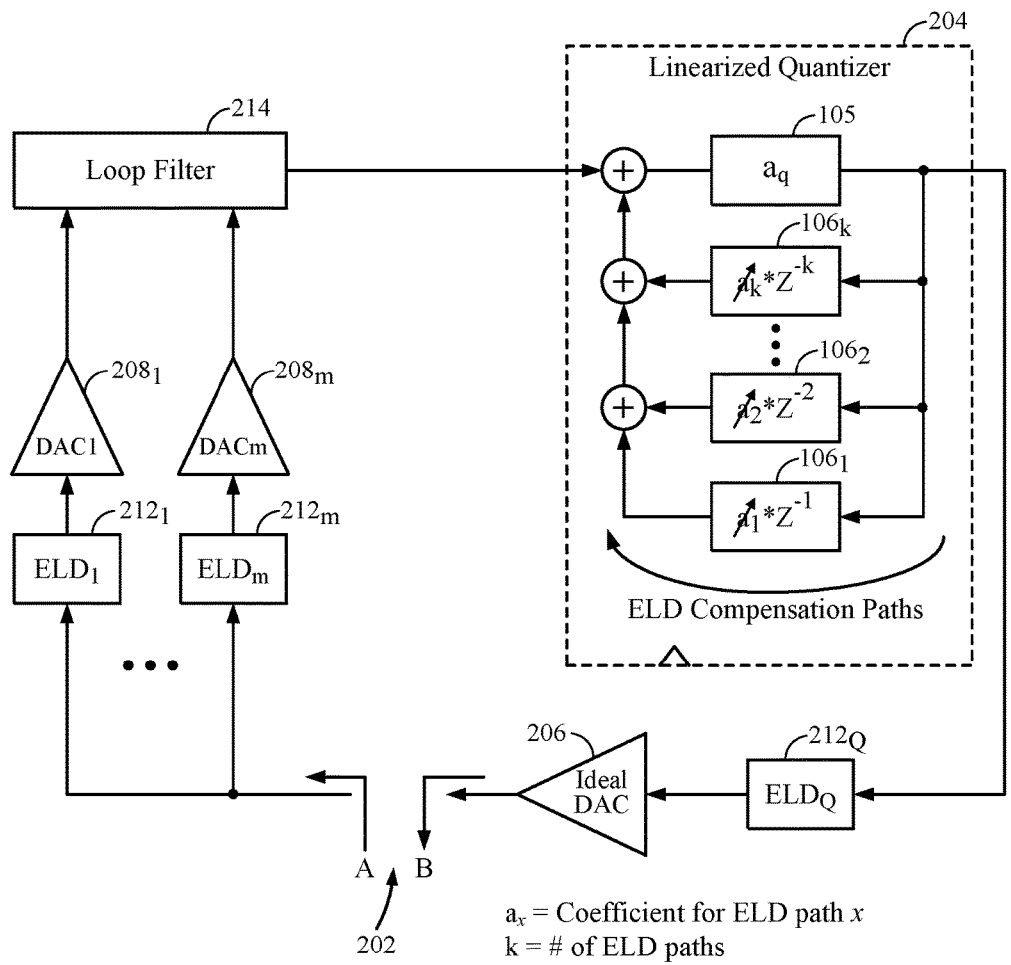
FIG. 2 illustrates an example configuration of the delta sigma ADC of FIG. 1 for deriving ELD compensation coefficients.

FIG. 2 illustrates an example configuration of the ADC 100 of FIG. 1 for deriving ELD compensation coefficients. To compute the coefficients in the ELD compensation paths 106, the ADC feedback path 104 is opened and linearized. For example, the ADC feedback path 104 has been opened as shown at 202. Also, the circuit has been linearized by including a linearized quantizer 204 having quantization logic 105 with a linearized gain of $a_Q$, an ideal DAC 206, m ideal DACs $208_1$ to $208_m$ (collectively referred to as "ideal DACs 208"), and an ideal loop filter 214. $ELD_x$ is the excess loop delay in the z or s domain shown at 212. The ELDs may be found in the feedback path 104 or in the quantizer 204. For example, the ideal DACs 208 are modeling the DACs 112. The DAC 206 is used to inspect the impulse response output in an analog format instead of a digital format.

The number of ELD paths is "k" in the ELD compensation paths 106, and the coefficient $a_x$ is the coefficient for ELD path x. The number of coefficients $a_x$ may be determined by the length of the longest amount of excess loop delay. For example, a guideline may be that the order should be greater than the ceiling of (ELD/Ts), where Ts is the sampling period for the ADC 100.

Figure 3:
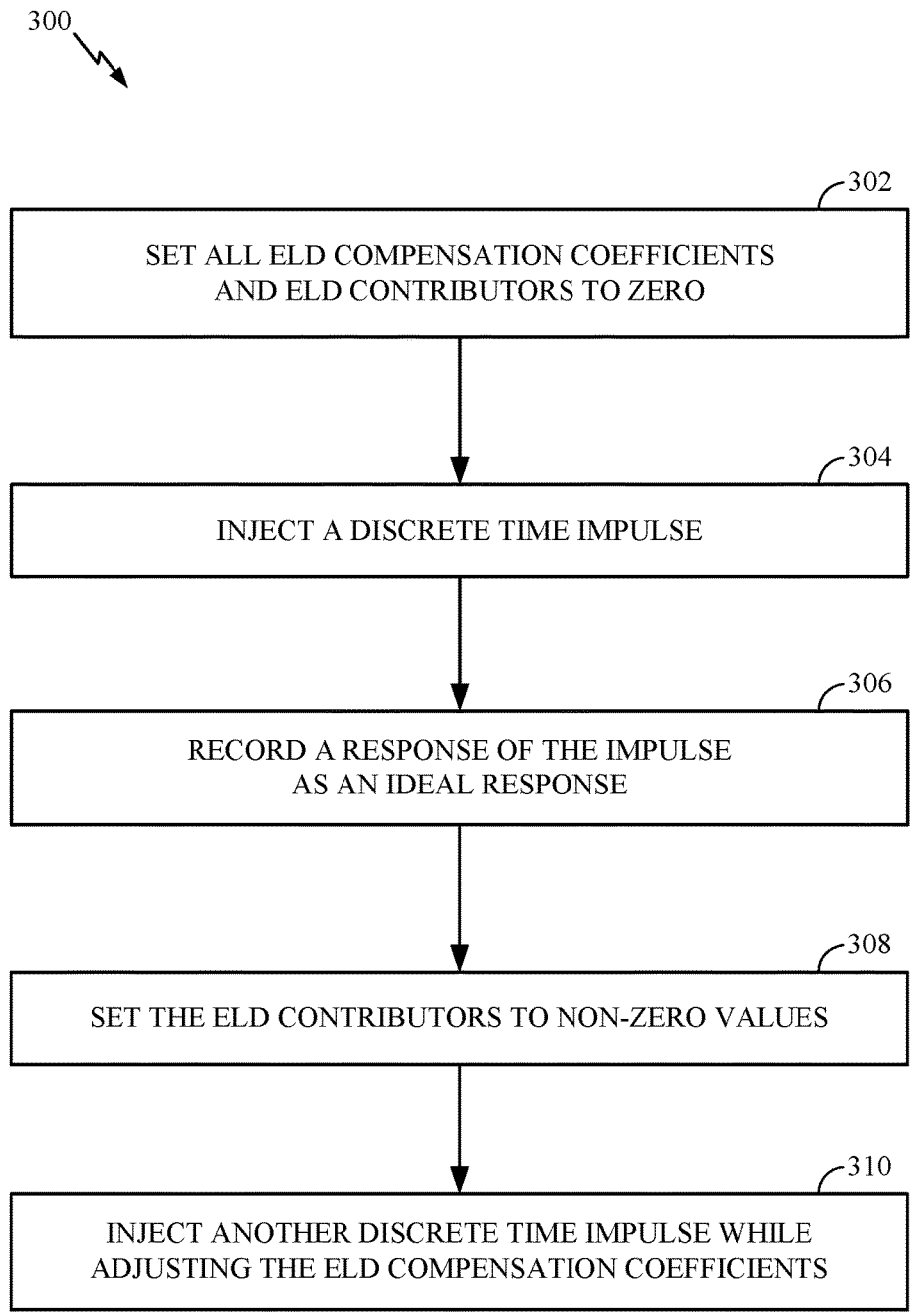
FIG. 3 is a flow diagram of example operations for determining the ELD compensation coefficients.

FIG. 3 is a flow diagram of example operations 300 for determining the ELD compensation coefficients $a_x$. Different coefficient sets may be determined for different ADC configurations. For certain aspects, the different coefficient sets are determined a priori, and can then be configured in an ADC. For example, for an ADC configuration, the applicable coefficients can be programmed for multiple ELD compensation paths 106. Also, if an ADC configuration changes during operation, the applicable coefficients corresponding to the change may be dynamically programmed.

In the programming process, at block 302, all ELD compensation coefficients $a_x$ and ELD contributors are set to zero. At block 304, a discrete time impulse is injected at node "A" shown in FIG. 2. At block 306 the impulse response received at node "B" is recorded as an ideal response, $B_{ideal}$.

After determining the ideal response, excess loop delays may then be included in the ADC 100 for testing. Thus, at block 308, the ELD contributors (e.g., $ELD_1$ $212_1$ to $ELD_m$ $212_m$ and $ELD_Q$ $212_Q$, collectively referred to as "ELDs 212") may be set to non-zero values. At block 310, a discrete time impulse is injected at node A while the ELD compensation coefficients $a_x$ are adjusted. For example, the ELD compensation coefficients $a_x$ may be adjusted via an impulse invariant solving algorithm to get the best fit between the ideal impulse response $B_{ideal}$ and the impulse response $B_{ideal\_approx}$, which is the impulse response after adjusting the ELD compensation coefficients $a_x$. Although an impulse invariant solving algorithm is used, other algorithms may be used, such as a mean squared error algorithm. The goal of the adjustment of the ELD compensation coefficients is to make the impulse response $B_{ideal\_approx}$ be the closest fit to the impulse response $B_{ideal}$.

As introduced above, certain aspects of the present disclosure provide for sampling rate (Fs) scaling of an ELD-compensated CTDSM ADC. One example Fs-scalable ELD compensation method involves: (1) normalizing the key contributors of ELD (e.g., quantizer-to-DAC delay and the GBW of the integrator amplifiers) to a nominal Fs=1; (2) compensating the CTDSM loop using the ELD finite-impulse response (FIR) compensation path (e.g., using the methodology described above and also in U.S. Pat. No. 9,325,341 to Dagher et al., filed Sep. 3, 2014 and entitled "Excess Loop Delay Compensation (ELC) for an Analog to Digital Converter (ADC), herein incorporated by reference in its entirety); and (3) scaling the key contributors to ELD with Fs. The latter operation may involve at least one of: (a) scaling the integrator BWs by scaling the integrator capacitors; (b) scaling the gain-bandwidth product (GBW) of the integrators' amplifiers with Fs as described below; and (c) scaling the quantizer-to-DAC delay as described below.

Referring back to the ADC 100 of FIG. 1, the quantizer 102 may have a quantizer-to-DAC delay (t_qdac), and the ELD compensation paths 106 may implement a finite-impulse response (FIR) filter. The loop filter 114 may be implemented with integrator stages 118 that have scalable gain and BW (denoted by gain-bandwidth product GBW, for each integrator stage $118_i$), where t_qdac and $GBW_i$ both contribute to the overall ELD. This ELD divided by the sampling period (Ts) (i.e., ELD/Ts) is a constant via the clock generator (where Ts=1/Fs). Furthermore, the ELD feedback path coefficients $a_x$ may be easily programmed to handle different CTDSM loop configurations and sampling rates, and the BW of the integrator stages 118 and the integrators' internal operational amplifiers (op amps) track Fs.

The ELD compensation methodology may entail the normalized ELD/Ts variations being well controlled within a few percent of the sampling period (e.g., ±5% of Ts). However, the quantizer-to-DAC output delay (td) variations may make meeting this tight variation quite challenging. The variations may be due to the conversion time of the quantizer and/or the data latches (D_latch) in the feedback DACs 112 variable clock-to-output delay (td). Although nearly finite, the conversion time will vary as a fraction of Ts. The latches of the feedback DACs 112 latch the output data from the quantizer 102. D_latch delay varies over process, voltage, and/or temperature (PVT) and can possibly go beyond the ELD variation range, especially for small Ts. For a robust wideband CTDSM ADC, it is highly desirable to have constant ELD over D_latch delay variation.

Figure 4:
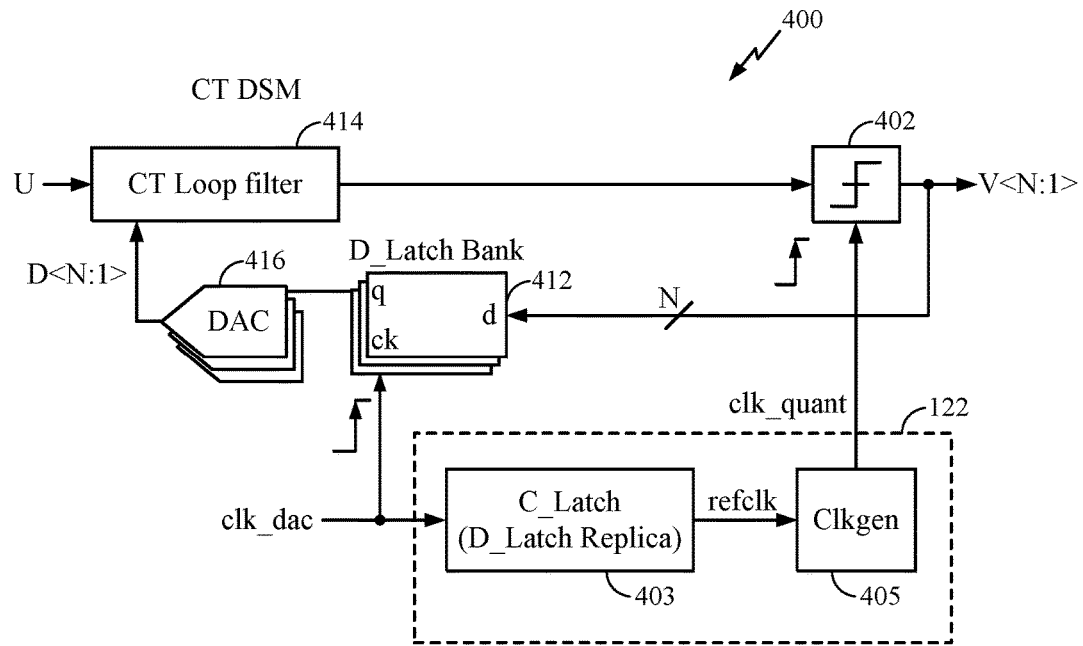
FIG. 4 is a block diagram of an example continuous-time delta-sigma modulator (CTDSM) ADC with a replica latch and a clock generator, in accordance with certain aspects of the present disclosure.

FIG. 4 is a block diagram of an example CTDSM ADC 400 for implementing constant quantizer-to-DAC delay, in accordance with certain aspects of the present disclosure. The CTDSM ADC 400 includes a continuous-time (CT) loop filter 414 and a quantizer 402, which is clocked by clk_quant, as described above. The digital output of the quantizer 402 (V<N:1>) is decoded and fed back to the CT loop filter 414 via feedback DACs 112 to produce feedback signals (D<N:1>). As illustrated in FIG. 4, the clocked feedback DACs 112 may be implemented by clocked data latches (represented by a D_latch bank 412) connected in series with the DACs (represented by a DAC bank 416). Each data latch in the D_latch bank 412 may be connected in series with one DAC in the DAC bank 416. The data latches are clocked by the input clock signal clk_dac as described above. The tunable clock delay circuit 122 generates a delayed clock signal (clk_quant) based on clk_dac.

In FIG. 4, the tunable clock delay circuit 122 includes a clock generator (clkgen) 405, which is used to generate a fixed quantizer-to-DAC output delay. For certain aspects, the clock generator 405 may be implemented with a delay-locked loop (DLL) generating numerous equally spaced phases of its input clock (here, reference clock (refclk)). By selecting the desired phase and assigning it to clk_quant, constant ELD/Ts can be maintained. The clock generator 405 need not be a DLL and may be any duty-cycle controlling clock generator, for example. The D_latch delay variations in the D_latch bank 412 may be effectively cancelled by inserting a C_latch cell 403 between the input clock (ckin) (here, the DAC clock (clk_dac)) and the clock that is driving the clock generator 405 (here, refclk). The C_latch cell 403 is a replica delay cell (a replica latch) based on a D_latch in a feedback DAC that nominally matches the D_latch's delay. Thus, C_latch's delays will track D_latch's delays and shift (advancing or retarding) the clock phases generated by the clock generator 405. This shift of clk_dac to produce refclk "hides" the D_latch variations in the feedback DACs 112 over PVT and keeps ELD/Ts constant for the ADC 400.

Figure 5:
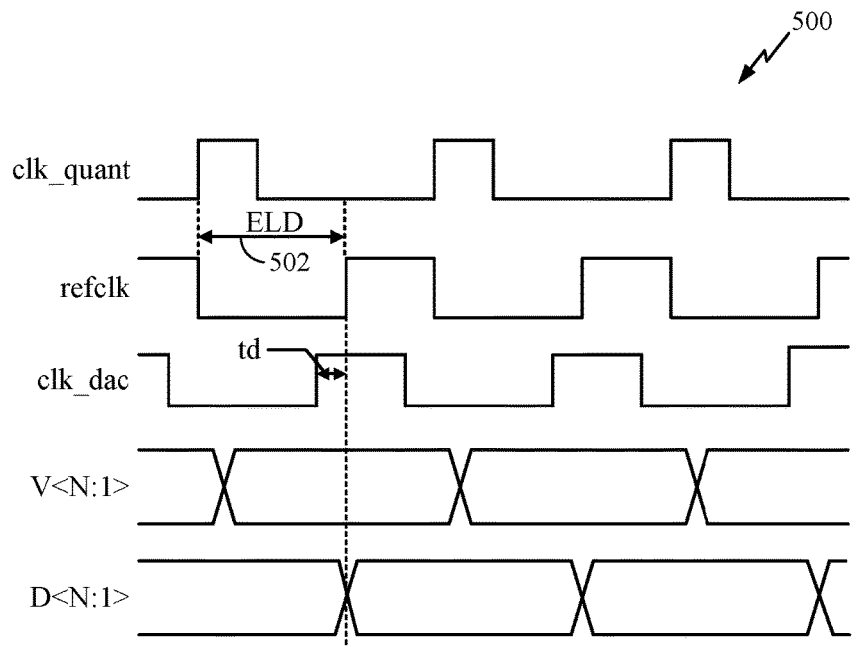
FIG. 5 is an example timing diagram for the CTDSM ADC of FIG. 4, in accordance with certain aspects of the present disclosure.

FIG. 5 is an example timing diagram 500 for the CTDSM ADC 400 of FIG. 4, in accordance with certain aspects of the present disclosure. In FIG. 5, the DAC latches (the D_latch bank 412) are enabled to update output data (D<N:1>) at the rising edge of clk_dac (the input clock for the ADC 400). The output of the loop filter 414 is sampled at the rising edge of clk_quant. The refclk is a delayed version of clk_dac, and the delay time (td) is set by the C_latch cell 403 (the replica latch). The clk_quant and refclk phase delta is set by the clock generator 405 (clkgen) and is a fixed percentage of Ts (e.g., ±5%). The phase delta is set to quantizer-to-DAC ELD target-td nominal. At the falling edge of clk_dac (D_latch hold phase), the C_latch output (refclk) will be reset to zero. At the rising edge of clk_dac (D_latch enable phase), the C_latch clock to output (clk_dac→refclk) goes through the same path as the D_latch clock to output (clk_dac→q) path. The C_latch rising edge delay (td) and the D_latch clk_dac→q delay track each other over PVT, so the D_latch delay variation is effectively cancelled and does not contribute to ELD variation. With this setup, the variable delay of the D_latch will shift refclk and clk_quant together and allow effective delay from clk_dac through the D_latch bank 412 to be within the targeted tolerance for the quantizer-to-DAC delay. As can also be seen in FIG. 5, the ELD 502 is the time from the rising edge of clk_quant to the effective change in the output data (D<N:1>).

Figure 6:
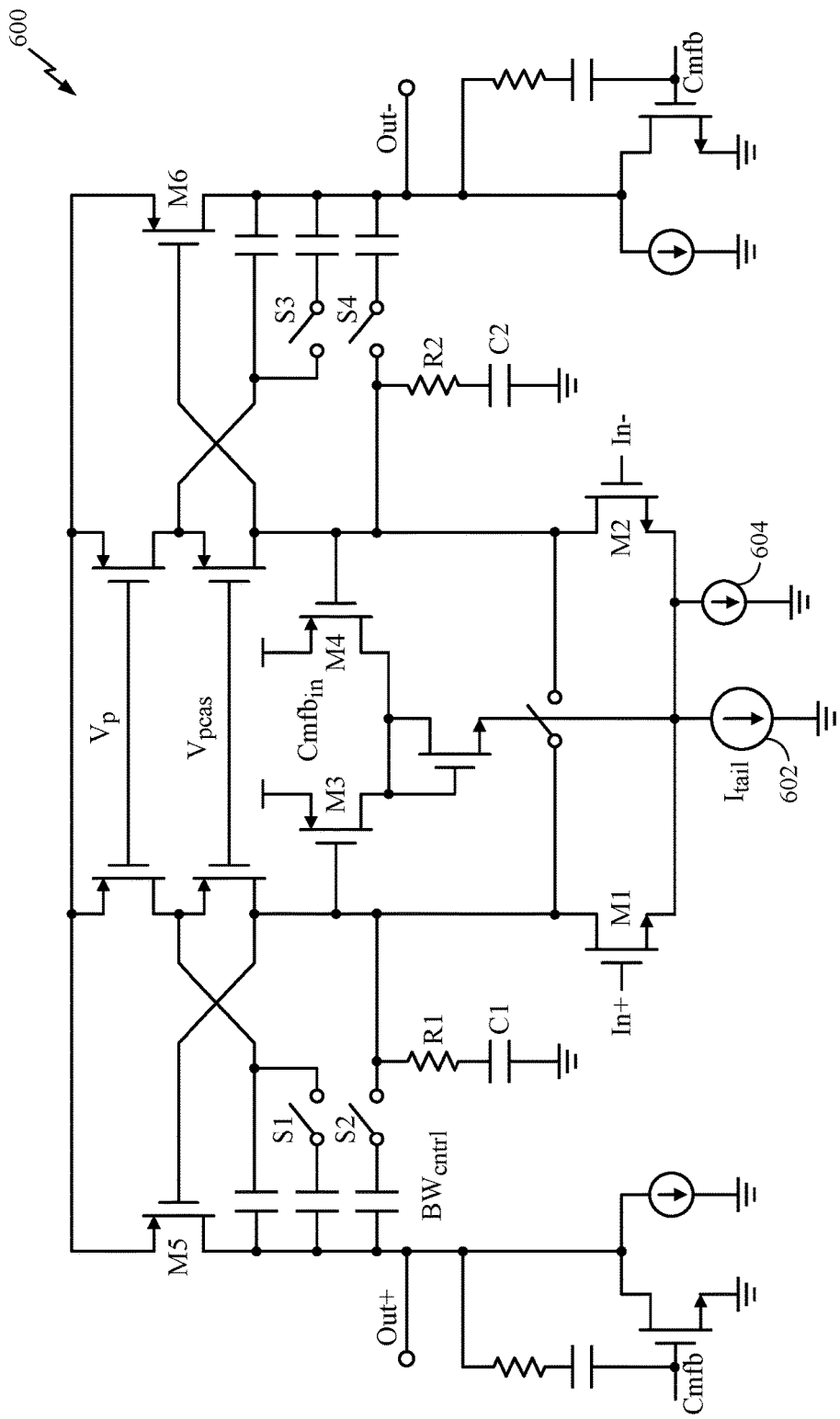
FIG. 6 is a schematic diagram of an example amplifier having a gain bandwidth product (GBW) that scales with frequency and is independent of process, voltage, and temperature (PVT), in accordance with certain aspects of the present disclosure.

FIG. 6 is a schematic diagram of an example amplifier 600 having a gain bandwidth product (GBW) that scales with frequency and is independent of process, voltage, and temperature (PVT), in accordance with certain aspects of the present disclosure. The amplifier 600 may be an amplifier within the integrator stage 118 of FIG. 1. The unity gain bandwidth (UGBW, also referred to as the unity gain crossover frequency or the gain-bandwidth product) of a classic Miller-compensated amplifier follows UGBW=$\beta$gm/$C_c$ as long as the second pole is far away. Therefore to ensure a PVT-independent UGBW that scales with frequency, it may be desirable for: (1) the transconductance (gm) to track the capacitor process variation and scale with the sampling frequency; (2) the second pole to scale with the UGBW to save power; and (3) the change in the feedback factor ($\beta$) in different modes of operation should not affect the UGBW. In this manner, the transfer function curve for the amplifier 600 tracks the sampling frequency (Fs) as Fs changes.

As illustrated in FIG. 6, a current source 602 for sinking current $I_{tail}$ may be generated from a switched-capacitor biasing circuit. Since $I_{tail}$ is proportional to the product of the sampling rate (Fs) and the capacitance (C) and affects the transconductance (gm), gm is also proportional to the product of Fs and C (I_tail$\propto$Fs$\times$C$\rightarrow$gm$\propto$Fs$\times$C). A compensation circuit for the first stage may scale the output current and adjust the location of the second pole. For example, the compensation circuit may be implemented with a common-mode feedback circuit composed of transistors M3, M4, M5, and M6 and current source 604, as illustrated in FIG. 6. A bandwidth control signal ($BW_{cntl}$) may control the switches S1, S2, S3, and/or S4 to effectively adjust the compensation capacitance (Cc) to accommodate the changes in $\beta$.

For certain aspects, the Ahuja compensation transient ringing may be damped by a series RC (e.g., R1 and C1 plus R2 and C2). The bandwidth control may introduce an extra pole-zero pair to compensate the zero from the Ahuja compensation. Unlike Miller compensation, the bandwidth does not vary with resistor corner (e.g., there is no nulling zero).

FIG. 6 illustrates several example variables that may be controlled in the amplifier 600. The main idea is to adjust the bandwidth of the amplifier 600 to ensure that the UGBW tracks the sampling frequency (Fs) as Fs changes. Different combinations of these and/or other suitable variables not mentioned here may be used to implement UGBW tracking of Fs.

Figure 7:
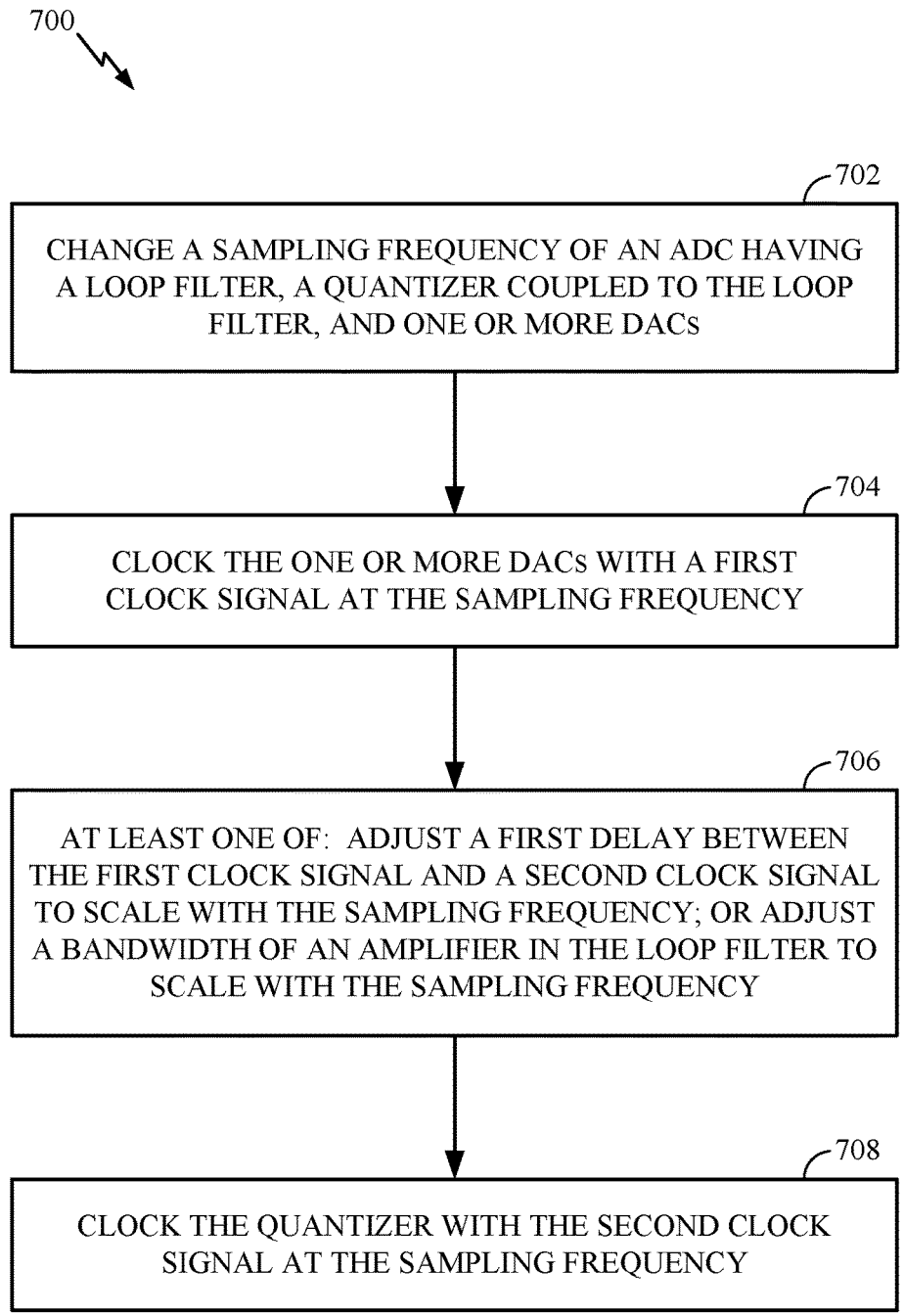
FIG. 7 is a flow diagram of example operations for sampling rate scaling in an ADC, in accordance with certain aspects of the present disclosure.

FIG. 7 is a flow diagram of example operations 700 for sampling rate scaling in an ADC, in accordance with certain aspects of the present disclosure. The operations 700 may be performed by the ADC, which may include a loop filter, a quantizer coupled to the loop filter, and one or more DACs coupled between an output of the quantizer and one or more inputs of the loop filter. For certain aspects, the operations may be performed in conjunction with a control circuit, which may include digital logic (e.g., a DSP).

The operations 700 may begin, at block 702, by changing a sampling frequency of the ADC. At block 704, the one or more DACs may be clocked with a first clock signal at the sampling frequency. At block 706, the operations 700 may involve adjusting at least one of: (1) a first delay between the first clock signal and a second clock signal to scale with the sampling frequency; or (2) a bandwidth of an amplifier in the loop filter to scale with the sampling frequency. At block 708, the quantizer may be clocked with the second clock signal at the sampling frequency.

According to certain aspects, the operation 700 may further include adjusting at least one capacitance of one or more integrators in the loop filter to scale with the sampling frequency.

According to certain aspects, adjusting the bandwidth of the amplifier in the loop filter at block 706 may involve adjusting a biasing current in the amplifier such that a transconductance of the amplifier scales with the sampling frequency.

According to certain aspects, adjusting the first delay between the first clock signal and the second clock signal at block 706 may entail setting the first delay as a percentage of a sampling period, the sampling period being an inverse of the sampling frequency.

According to certain aspects, the operations 700 may further include generating the second clock signal by adding the first delay and a second delay to the first clock signal, wherein the second delay matches a third delay in one of the DACs over process, voltage, and temperature (PVT).

According to certain aspects, the operations 700 may further comprise scaling excess loop delay (ELD) compensation coefficients with the sampling frequency, wherein the ELD compensation coefficients are applied to ELD compensation paths coupled to the quantizer.

Certain aspects of the present disclosure provide an ADC. The ADC generally includes a loop filter; a quantizer having an input coupled to an output of the loop filter; one or more digital-to-analog converters (DACs), each having an input coupled to an output of the quantizer, an output coupled to an input of the loop filter, and a data latch comprising a clock input for the DAC coupled to a clock input for the ADC; a replica latch replicating the data latch of one of the DACs and having an input coupled to the clock input for the ADC; and a clock generator having an input coupled to an output of the replica latch and an output coupled to a clock input for the quantizer.

According to certain aspects, the ADC comprises a continuous-time delta-sigma modulator (CTDSM) ADC.

According to certain aspects, the replica latch is configured to track process, voltage, and temperature (PVT) of the data latch of the one of the DACs.

According to certain aspects, the quantizer includes a combiner having a first input coupled to the input of the quantizer; and one or more excess loop delay (ELD) compensation paths, each ELD compensation path having an input coupled to the output of the quantizer and an output coupled to a second input of the combiner. For certain aspects, each ELD compensation path has a compensation coefficient that remains fixed irrespective of a sampling rate for the ADC.

According to certain aspects, the ADC has an ELD, where the ELD divided by a sampling period for the ADC remains constant regardless of changes in the sampling period. For certain aspects, the clock generator is configured to output a clock signal having a delay added to the output of the replica latch, wherein the delay is configured to be selected based on a sampling rate for the ADC, such that the ELD divided by the sampling period for the ADC remains constant. The delay may be a fixed percentage of the sampling period.

According to certain aspects, the clock generator comprises a delay-locked loop (DLL).

According to certain aspects, the quantizer comprises a time-to-digital converter configured to convert an analog input signal received from the loop filter at the input of the quantizer to a digital signal at the output of the quantizer.

According to certain aspects, the loop filter includes one or more integrator stages, each integrator stage comprising an operational amplifier with a tunable feedback capacitor configured to be adjusted based on a sampling rate for the ADC. For certain aspects, the operational amplifier (in each integrator stage) further includes a transconductance adjusting circuit configured to adjust a transconductance of the operational amplifier based on the sampling rate for the ADC. For certain aspects, the operational amplifier (in each integrator stage) further includes a compensation circuit configured to adjust a location of a pole in the frequency response for the operational amplifier based on the sampling rate for the ADC.

According to certain aspects, the ADC further includes a decoder having an input coupled to an output of the quantizer and having an output coupled to each input of the DACs.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal, supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. An analog-to-digital converter (ADC) comprising:
 a loop filter;
 a quantizer having an input coupled to an output of the loop filter;
 one or more digital-to-analog converters (DACs), each having an input coupled to an output of the quantizer, an output coupled to an input of the loop filter, and a data latch comprising a clock input for the DAC coupled to a clock input for the ADC; and
 a clock delay circuit having an input coupled to the clock input for the ADC and an output coupled to a clock input for the quantizer, wherein the clock delay circuit comprises: a replica latch replicating the data latch of one of the DACs and having an input coupled to the clock input for the ADC; and a clock generator having an input coupled to an output of the replica latch and an output coupled to the clock input for the quantizer.

2. The ADC of claim 1, wherein the replica latch is configured to track process, voltage, and temperature (PVT) of the data latch of the one of the DACs.

3. The ADC of claim 1, wherein the ADC has an excess loop delay (ELD) and wherein the ELD divided by a sampling period for the ADC remains constant regardless of changes in the sampling period.

4. The ADC of claim 3, wherein the clock generator is configured to output a clock signal having a delay added to the output of the replica latch and wherein the delay is configured to be selected based on a sampling rate for the ADC, such that the ELD divided by the sampling period for the ADC remains constant.

5. The ADC of claim 4, wherein the delay is a fixed percentage of the sampling period.

6. The ADC of claim 1, wherein the clock generator comprises a delay-locked loop (DLL).

7. An analog-to-digital converter (ADC) comprising:
a loop filter;
a quantizer having an input coupled to an output of the loop filter; wherein the quantizer comprises: a combiner having a first input coupled to the input of the quantizer; and one or more excess loop delay (ELD) compensation paths, each ELD compensation path having an input coupled to the output of the quantizer and an output coupled to a second input of the combiner;
one or more digital-to-analog converters (DACs), each having an input coupled to an output of the quantizer, an output coupled to an input of the loop filter, and a data latch comprising a clock input for the DAC coupled to a clock input for the ADC; and
a clock delay circuit having an input coupled to the clock input for the ADC and an output coupled to a clock input for the quantizer.

8. The ADC of claim 7, wherein each ELD compensation path has a compensation coefficient that remains fixed irrespective of a sampling rate for the ADC.

9. The ADC of claim 1, wherein the quantizer comprises a time-to-digital converter configured to convert an analog input signal received from the loop filter at the input of the quantizer to a digital signal at the output of the quantizer.

10. An analog-to-digital converter (ADC) comprising:
a loop filter, wherein the loop filter comprises one or more integrator stages, each integrator stage comprising an operational amplifier with a tunable feedback capacitor configured to be adjusted based on a sampling rate for the ADC;
a quantizer having an input coupled to an output of the loop filter;
one or more digital-to-analog converters (DACs), each having an input coupled to an output of the quantizer, an output coupled to an input of the loop filter, and a data latch comprising a clock input for the DAC coupled to a clock input for the ADC; and
a clock delay circuit having an input coupled to the clock input for the ADC and an output coupled to a clock input for the quantizer.

11. The ADC of claim 10, wherein the operational amplifier further comprises a transconductance adjusting circuit configured to adjust a transconductance of the operational amplifier based on the sampling rate for the ADC.

12. The ADC of claim 10, wherein the operational amplifier further comprises a compensation circuit configured to adjust a location of a pole in the frequency response for the operational amplifier based on the sampling rate for the ADC.

13. The ADC of claim 1, further comprising a decoder having an input coupled to an output of the quantizer and having an output coupled to each input of the DACs.

14. The ADC of claim 1, wherein the ADC comprises a continuous-time delta-sigma modulator (CTDSM) ADC.

15. A method for sampling rate scaling in an analog-to-digital converter having a loop filter, a quantizer coupled to the loop filter, and one or more digital-to-analog converters (DACs) coupled between an output of the quantizer and one or more inputs of the loop filter, the method comprising:
changing a sampling frequency of the ADC;
clocking the one or more DACs with a first clock signal at the sampling frequency;
at least one of:
adjusting a first delay between the first clock signal and a second clock signal to scale with the sampling frequency; or
adjusting a bandwidth of an amplifier in the loop filter to scale with the sampling frequency; and
clocking the quantizer with the second clock signal at the sampling frequency.

16. The method of claim 15, further comprising adjusting at least one capacitance of one or more integrators in the loop filter to scale with the sampling frequency.

17. The method of claim 15, wherein adjusting the bandwidth of the amplifier in the loop filter comprises adjusting a biasing current in the amplifier such that a transconductance of the amplifier scales with the sampling frequency.

18. The method of claim 15, wherein adjusting the first delay between the first clock signal and the second clock signal comprises setting the first delay as a percentage of a sampling period, the sampling period being an inverse of the sampling frequency.

19. The method of claim 15, further comprising generating the second clock signal by adding the first delay and a second delay to the first clock signal, wherein the second delay matches a third delay in one of the DACs over process, voltage, and temperature (PVT).

20. The method of claim 15, further comprising scaling excess loop delay (ELD) compensation coefficients with the sampling frequency, wherein the ELD compensation coefficients are applied to ELD compensation paths coupled to the quantizer.

* * * * *